United States Patent [19]
Malhi et al.

[11] Patent Number: 5,088,190
[45] Date of Patent: Feb. 18, 1992

[54] METHOD OF FORMING AN APPARATUS FOR BURN IN TESTING OF INTEGRATED CIRCUIT CHIP

[75] Inventors: Satwinder Malhi, Garland; Oh-Kyong Kwon, Richardson, both of Tex.

[73] Assignee: Texas Instruments Incorporated, Dallas, Tex.

[21] Appl. No.: 575,456

[22] Filed: Aug. 30, 1990

[51] Int. Cl.$^5$ .................................. H01R 9/06
[52] U.S. Cl. ........................ 29/843; 174/254; 357/26; 357/79; 439/197; 439/513
[58] Field of Search ............ 439/513, 197; 357/79, 357/26; 174/254; 29/843

[56] References Cited
U.S. PATENT DOCUMENTS

| | | | |
|---|---|---|---|
| 3,596,228 | 7/1971 | Reed, Jr. et al. | 439/513 |
| 3,832,769 | 9/1974 | Olyphant, Jr. et al. | 174/254 X |
| 4,048,438 | 9/1977 | Zimmerman | 174/259 |
| 4,237,607 | 12/1980 | Ohno | 174/254 X |
| 4,510,017 | 4/1985 | Barber | 204/15 X |
| 4,649,339 | 3/1987 | Grangroth et al. | 439/197 X |
| 4,779,340 | 10/1988 | Kihm et al. | 174/254 X |
| 4,968,589 | 11/1990 | Perry | 204/15 X |

*Primary Examiner*—Carl J. Arbes
*Attorney, Agent, or Firm*—James C. Kesterson; B. Peter Barndt; Richard L. Donaldson

[57] ABSTRACT

An integrated circuit AC test and burn-in socket (10) for communicating test signals between test circuitry and an integrated circuit chip (11) comprises connection circuitry (32) associated to engage the chip (11) and communicate test signals between the chip (11) and the test circuitry. A compliant base (34) supports the circuitry (32) and assures positive engagement and electrical connection between the circuitry (32) and the chip (11). A socket assembly (20 and 21) holds the chip (11) in engagement with the connection circuitry (32).

7 Claims, 3 Drawing Sheets

METHOD OF FORMING AN APPARATUS FOR BURN IN TESTING OF INTEGRATED CIRCUIT CHIP

TECHNICAL FIELD OF THE INVENTION

This invention relates in general to integrated circuit testing, and more particularly to an integrated circuit chip burn-in socket and method.

BACKGROUND OF THE INVENTION

Electronic systems often comprise many individual integrated circuit chips packaged together in a multiple integrated circuit chip module. Multiple-chip module assembly methods include a test known as integrated circuit chip burn-in testing. Burn-in testing includes operating the integrated circuits at a higher than normal operating temperature and voltage to overstress the chips. These tests assure that integrated circuits being tested can satisfy normal operating conditions for which they are designed.

Multiple-chip modules have leads that permit easy electrical connection to the individual chips. At one time, integrated circuit chips were often more expensive than the packaging to which they were attached in forming multiple chip modules. Furthermore, earlier multi-chip integrated circuit modules had fewer chips per module. As a result, it made sense to first assemble integrated circuit chips to the multiple-chip module packaging and then test the individual chips. If a chip failed, the entire module would be discarded. The combined cost and difficulty of testing and perhaps having to discard the entire multiple-chip module, however, was usually less than that of testing and perhaps having to discard the smaller individual chips.

Today's more sophisticated and complicated integrated circuits and packaging technologies have significantly changed cost considerations for integrated circuit module fabrication. With more expensive packaging for complicated integrated circuit modules, as well as reduced integrated circuit fabrication costs, in many cases a significantly larger portion of total fabrication costs go to the packages supporting integrated circuit chips. For complicated circuits and their supporting packaging, it no longer makes economic sense to discard the entire multiple-chip module in the event of a failed integrated circuit chip.

Consequently, there is a need for a device and method that permits integrated circuit chip testing prior to assembly into a multiple-chip integrated circuit module.

Some attempts have been made to overcome limitations associated with test devices that can only test integrated circuits after packaging. For example, U.S. Pat. application Ser. No. 330,839, filed Mar. 30, 1989, entitled "Flip Chip Test Socket Adapter and Method" by S. Malhi, et al., incorporated by reference herein, describes a test socket adapter. That application discloses a method and apparatus for allowing bare chips, i.e., integrated circuit chips prior to packaging, to be tested for burn-in testing. In the Malhi test socket adapter, a bare integrated circuit chip may be inserted into and held. Cantilever beams on the Malhi device deflect and compensate for planarity variations at electrical connections when the chip engages the test socket adapter. The deflection of the cantilever beams allows a positive contact between the test connections and the cantilever beams for burn-in testing.

While the Malhi disclosure solves numerous problems associated with integrated circuit chip testing, significant improvement in such devices is yet necessary. In particular, the cantilever beam structure can only accommodate an integrated circuit chip having a line array of landing pads or solder bumps. That is, only if the integrated circuit test connections surround the perimeter of integrated circuit chip can the cantilever beam structure test the integrated circuit chip. While numerous integrated circuit chips have such a configuration, more complex high performance integrated circuit chips use test connections interior to the perimeter of integrated circuit chip. Additionally, the mechanical structure and materials of the cantilever beams allows no greater separation between the beams than approximately 100 microns. These two problems limit the complexity or, similarly, the test connection density (i.e., number of test connections per unit area) that the test socket adapter can accommodate. Furthermore, the cantilever beams are brittle and can be deflected no more than approximately 50 microns without breaking. This imposes a limit on the planarity differences that can exist between the integrated circuit chip and the adapter.

Thus, there is a need for an integrated circuit chip socket adapter that can provide test connections interior to the perimeter of the integrated circuit chip.

There is also a need for a bare integrated circuit chip test socket that can provide greater test connection density than known devices.

Additionally, there is a need for a bare integrated circuit chip burn-in test socket that provides sufficient compliance for greater planarity differences than conventional adapters provide.

SUMMARY OF THE INVENTION

The present invention provides an apparatus and method for high performance and high density burn-in testing of bare integrated circuit chips. The invention comprises a connection circuit secured to a compliant base and a socket assembly that holds a bare integrated circuit chip to provide an electrical path from the chip to test circuitry via the connection circuit.

In accordance with one aspect of the invention, there is provided a high density integrated circuit burn-in socket for burn-in testing of a bare integrated circuit chip prior to integrating the chip with a number of other chips in a multiple-chip module. The high-density connection circuit comprises either a line array or area array of landing pads and solder bumps designed to engage respective solder bumps and landing pads on an integrated circuit chip to be tested.

The compliant base includes a substrate to which a compliant layer and an etched metal layer is attached. The metal layer includes a connection circuit, a portion of which essentially mirrors the circuits of the integrated circuit chip design. A ceramic disk, called a nest, adjoins the metal layer and receives the bare integrated circuit chip to assure proper alignment between integrated circuit chip and the connection circuit of the metal layer. A socket assembly receives the compliant base and includes connections from the metal layer connection circuit through to test circuitry. Additionally, the socket assembly provides a securing mechanism to assure positive engagement of the bare integrated circuit chip within the nest.

In a further aspect of the invention, the compliant insulator comprises a layer of polyimide or other compliant material having a sufficient thickness and compliance to absorb anticipated planarity differences between integrated circuit test connections and the connection circuit. The connection circuit is designed to have solder bumps to engage integrated circuit landing pads. Alternatively, where the integrated circuit chip connection has its own solder bumps, the connection circuit design associates a landing pad with each such solder bump to electrically mate with the integrated circuit chip solder bump.

A technical advantage of the present invention is that it permits bare integrated circuit chip testing prior to the integrated circuit chip being integrated with a number of chips in a multiple-chip module. This can significantly reduce multiple-chip module fabrication costs.

Another technical advantage of the present invention is that the connection circuit is made from an etched metal layer. The present invention can provide a larger number of electrical connections per unit area between the bare integrated circuit chip and the test circuitry. This greater density is critical to the higher density test connections characteristic of today's more complex integrated circuit chips.

Another technical advantage is that by adhering the connection circuitry to a compliant layer, the present invention provides a more durable and resilient test circuit connection.

Yet another technical advantage of the present invention is that by applying the metal layer to the polyimide coat and etching the metal layer, it is possible to create a two-dimensional circuit having test connections extending beyond the perimeter of the integrated circuit chip. This aids in testing more complex integrated circuit chips.

Moreover, the combination of high density integrated circuit chip test connection circuitry and the ability of the present invention to make connections within the perimeter of the integrated circuit chip is a further technical advantage of the present invention.

BRIEF DESCRIPTION OF THE DRAWINGS

For a more complete understanding of the present invention and for further advantages thereof, reference is now made to the following detailed description, taken in conjunction with the accompanying FIGURES, in which.

DETAILED DESCRIPTION OF THE INVENTION

The preferred embodiment of the present invention is best understood by referring to the FIGURES, like numerals being used for like and corresponding parts of the various drawings.

Figure 1:
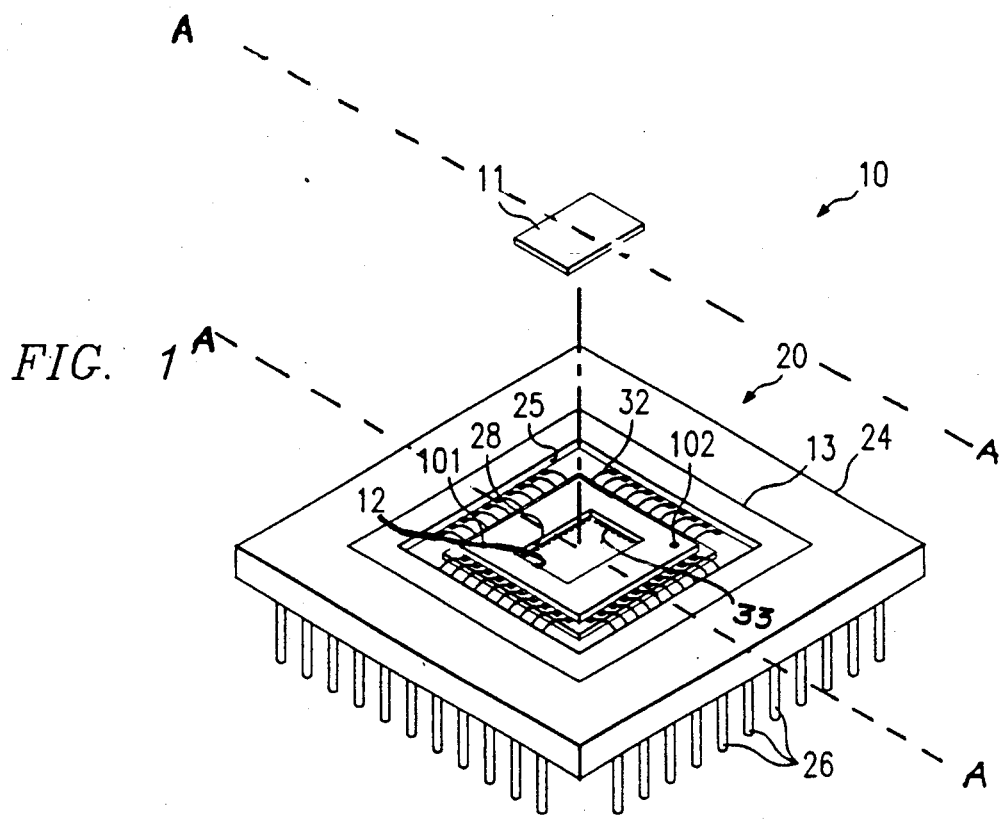
FIG. 1 is a perspective view of a high density integrated circuit chip test socket constructed in accordance with a preferred embodiment of the present invention.
Figure 1:
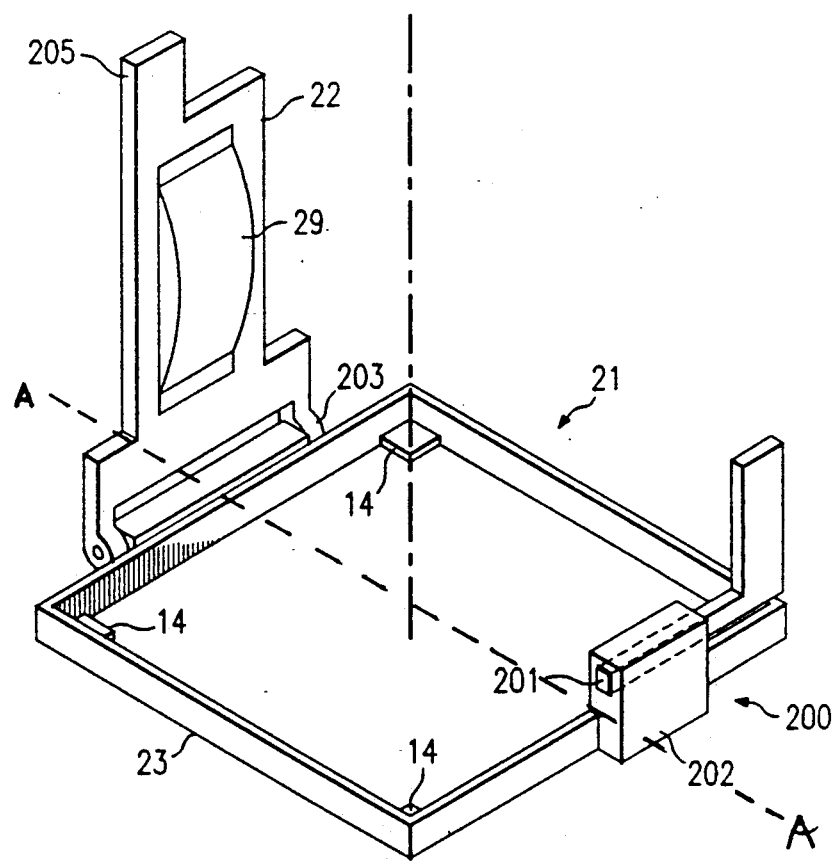

FIG 1 is an exploded perspective view of a high-density integrated circuit chip burn-in socket 10 constructed in accordance with the preferred embodiment of the present invention. According to FIG. 1, chip burn-in socket 10 comprises two principal sections, socket unit 20 and socket frame 21 into which socket unit 20 fits. Socket unit 20 receives integrated circuit chip 11. Socket unit 20 comprises socket block 24 from which extend connector pins 26. At the uppermost surface of socket block 24 appears ground plate 13 to which attach wire bondings 25 which in turn, connect to connection circuit 32. Next 28 adjoins connection circuit 32 and comprises orientation holes 101, 102 and nest opening 12. Integrated circuit chip 11 fits within nest opening 12 and connects to connection leads 33 of connection circuit 32, as will be seen.

Socket frame 21 includes corner supports 14, frame wall 23, and frame lid 22. Compression spring 29 mounts to frame lid 22 by pivoting lid hinge 203 and connects frame lid 22 to socket frame 21. To secure lid hinge 22 over the socket frame 21, latch 200 attaches to frame wall 203. Notch 200 comprises latch base 202 through which latch pin 201 moves.

As FIG. 1 indicates, nest opening 12 of nest 28 is precisely defined to receive integrated circuit chip 11. Orientation holes 101 and 102 assure proper positioning when installing nest 28 over connection circuit 32. Socket frame 21 receives socket unit 20 with frame walls 23 surrounding the perimeter of socket block 24. Connector pins 26, when socket unit 20 is within socket frame 21, extend below socket frame 21 to permit connection with test circuitry not shown. With socket unit 20 in socket frame 21, frame lid 22 is designed to close over socket unit 20. Latch 200 is designed to secure frame lid 22 over socket unit 20 by extending latch pin 201 over lid tip 205, thereby holding chip 11 firmly within nest 28.

Figure 2:
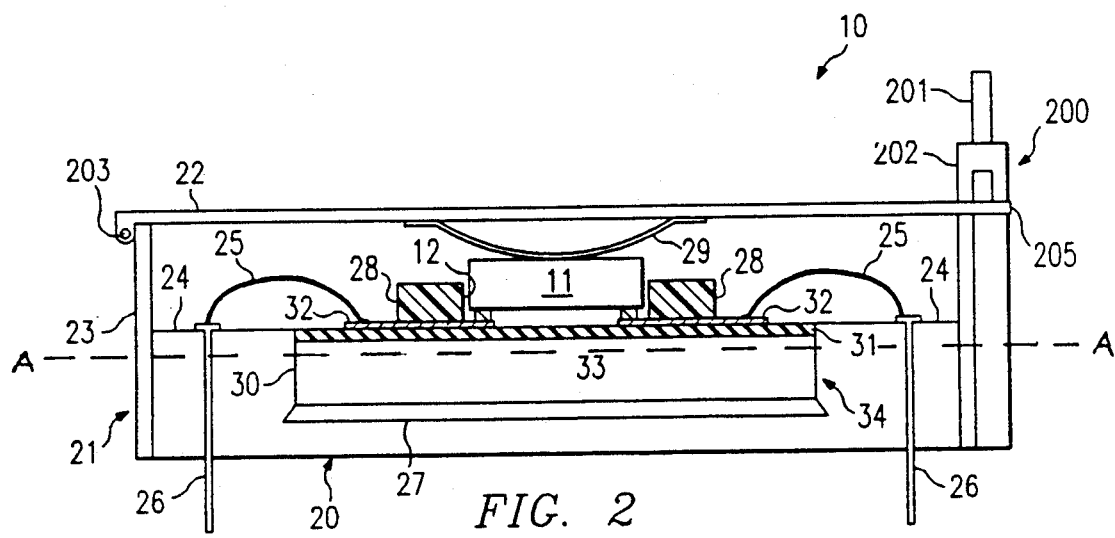
FIG. 2 is a cross-sectional schematic view of the chip burn-in socket of FIG. 1.

FIG. 2 is a cross-sectional schematic view of the integrated chip burn-in socket 10 of FIG. 1. FIG. 2 shows socket unit 20 mounted within socket frame 21. Frame lid 22 pivots on lid hinge 203 and is secured over frame walls 23 by latch 200. Latch 200 comprises latch pin 201 which fits through latch base 202 and over lid tip 205. Compression spring 29 mounts to frame lid 22 and presses integrated circuit chip 11 against solder bumps 33. Solder bumps 33 attach to connection circuit 32 and provide an electrical connection to chip 11. Connection circuit 32 adjoins compliant layer 31 and has wire bondings 25 that connect to connector pins 26. Connector pins 26 penetrate through socket block 24 and extend sufficiently to connect to appropriate test circuitry and provide an electrical path between wire bondings 25 and the test circuitry. Compliant layer 31 adjoins substrate 30 which attaches to foundation plate 27. Foundation plate 27 mounts within socket block 24.

Compression spring 29, in the preferred embodiment, comprises a blade spring with a blade section that exerts a positive spring force against integrated circuit chip 11 when frame lid 22 is locked in position. An alternative embodiment to the blade spring configuration of compression spring 29 may be a screw assembly that may attach to the outer surface of frame lid 22 and extend through frame lid 22 to direct a variable positive pressure against integrated circuit chip 11. Thus, screwing the compression screw against the back surface of integrated circuit chip 11 assures positive engagement between solder bumps 33 and integrated circuit chip 11.

A critical design parameter of the present invention is the size and orientation of nest opening 12 (FIG. 1) that receives integrated circuit chip 11. Nest opening 12 must be only slightly larger than the planar area of integrated circuit chip 11. Nest opening 12 has an orientation that permits the connection points of integrated circuit chip 11 to mate precisely with solder bumps 33.

Connection circuit 32 is modeled from the data base of the integrated circuit chip to be tested. Thus, using conventional semiconductor device fabrication techniques, the data base of the integrated circuit chip 11 can be adapted to form test connection circuit 32. This integrated circuit can be formed by known integrated circuit fabrication techniques including etching a thin metal layer to form the integrated circuit. Furthermore, although FIG. 2 shows a solder bump 33 to connect to integrated circuit chip 11, this assumes that there is an associated landing pad on the chip 11. If, instead, chip 11 has a solder bump with which connection circuit 32 must associate, a landing pad on connection circuit 32 can replace solder bump 33.

Compliant layer 31 may be any compliant material that can be deposited by semiconductor device fabrication techniques and which has sufficient compliance properties for the purposes of the present invention as will be discussed. Substrates 30 comprises a silicon material but may be another material such-as quartz, depending on desired material and conducted properties. Substrate 30 attaches to foundation plate 27 by adhesive or other means. Foundation plate 27 has a outwardly bevelled edge that anchors foundation plate 27. Through a bonded layer between foundation plate 27 and substrate 30, the remainder of socket test head 34 rigidly mounts within socket block 24.

In the preferred embodiment of the present invention, socket unit 20 components use various materials. For example, nest 28 comprises a ceramic material in which a laser drill may cut orientation holes 101 and 102 as well as nest opening 12. Connection circuit 32, wire bondings 25, and connector pins 26 may comprise a tungstenized gold material that provides sufficient strength and electrical conductivity for the needs of the present invention. Solder bumps 33 may use a tungstenized gold alloy for electrical connection to connection circuit 32. Compliant layer 31 may be a polyimide layer for which compressive properties vary as a function of layer thickness. Substrate 30 may be silicon, although other rigid materials may be used. Foundation plate 27 may also comprise silicon or other material sufficient to rigidly anchor socket test head 34 thereto with the use of epoxy or one other adhesive. Additionally, and adhesive may be used to affix nest 28 firmly to connection circuit 32.

Figure 3:
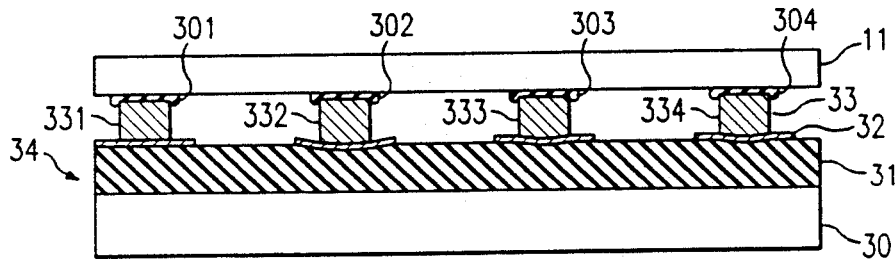
FIG. 3 is a cross-sectional schematic view of an integrated circuit chip engaging the connection circuit according to a preferred embodiment of the present invention.
Figure 4:
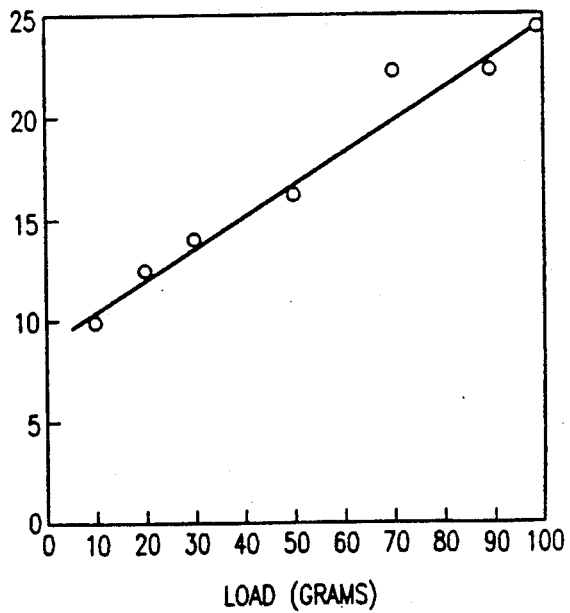
FIG. 4 is an empirically determined plot of compression versus load for a polyimide film used in a preferred embodiment of the present invention.

FIGS. 3 and 4 are related and show compressive properties that compliant layer 31 may possess to absorb planarity differences between connections on integrated circuit chip 11 and solder bumps 33 of socket test head 34.

FIG. 3 shows a representative engagement of integrated circuit chip 11 with socket test head 34. In FIG. 3, integrated circuit chip 11 includes landing pads 301, 302, 303 and 304 which receive solder bumps 33, including individual bumps 331, 332, 333 and 334. Solder bumps attach to respective connection circuit which attach to compliant layer 31. Compliant layer 31 mounts to substrate 30.

As FIG. 3 shows, solder bump 331 mates with landing pad 301 without any compression of compliant layer 31. Solder bumps 333 and 334, however, mate with pads 303 and 304 and make depressions of approximately equal magnitude within compliant layer 31 upon their respective engagements. The connection between landing pad 302 and solder bump 333 makes an even larger depression in compliant layer 31. Compliant layer 31 absorbs this difference however. Note that rigid substrate 30 evenly distributes force among the four connections of FIG. 3, and compliant layer 31 cooperates to assure positive connection among all four landing pad-solder bump combinations.

FIG. 4 illustrates the relationship between compliant layer 31 compression and load using as compliant layer 31 a material having the trade name Hitachi PIQ 3600 with a load area of $6.22 \times 10^{-3}$ cm$^2$. FIG. 4 illustrated that as the load upon compliant layer 31 increases, the compression as a percent of initial thickness also increases in approximately linearly. With this information, it is a simple matter to determine the necessary thickness of compliant layer 31. In other words, the thickness may be adjusted as a function of the anticipated planarity differences that compliant layer 31 must absorb. Obviously, if materials other that Hitachi PIQ 3600 are used for compliant layer 31, a similar compression versus load characteristic curve can be generated. Different materials may also require varying thicknesses of complaint layer 31 for anticipated planarity differences and loads.

FIGS. 5a–d provide cross-sectional views of a segment of socket test head 34, that illustrates the use of known semiconductor fabrication techniques. The fabrication technique that FIGS. 5 a–d illustrate is similar to those shown in U.S. Pat. application Ser. No. 07/560,398, filed July 31, 1990, entitled "High Performance AC Test Head," by Kwon et. al., who are also co-inventors of the present invention, which patent application in its entirety is hereby incorporated.

Figure 5A:
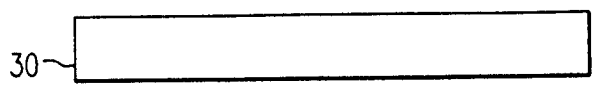
FIGS. 5a–d are cross-sectional views of a method for constructing the compliant base and connection circuit of the socket test head of a preferred embodiment of the present invention.
Figure 5B:
Figure 5C:
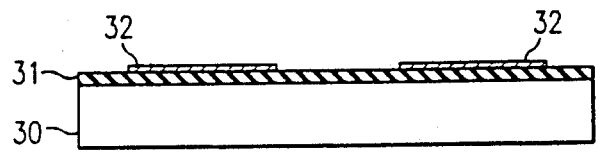
Figure 5D:
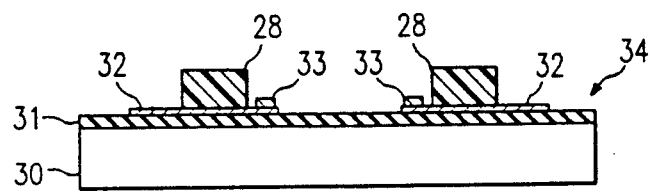

The fabrication sequence of FIGS. 5a–d begins with a silicon substrate of sufficient thickness for the present invention. FIG. 5b shows the application of a thin polyimide coat to serve as compliant layer 31 on substrate 30. Polyimide coat 31 can be applied using known semiconductor fabrication techniques. FIG. 5c shows the creation of connection circuit 32 over compliant layer 31. Connection circuit 32 appears as a result of depositing metal on the top of polyimide film 31 and etching or otherwise patterning the layer to provide an electrical path forming connection circuit 32 for connecting the integrated circuit chip to the test circuitry. FIG. 5d shows the creation of solder bump 33 serving as connection lead 33. Metal bump 33 is a hard metal material coated with tungstenized gold that can provide positive connection between integrated circuit chip 11 and connection circuit 32.

Figure 6:
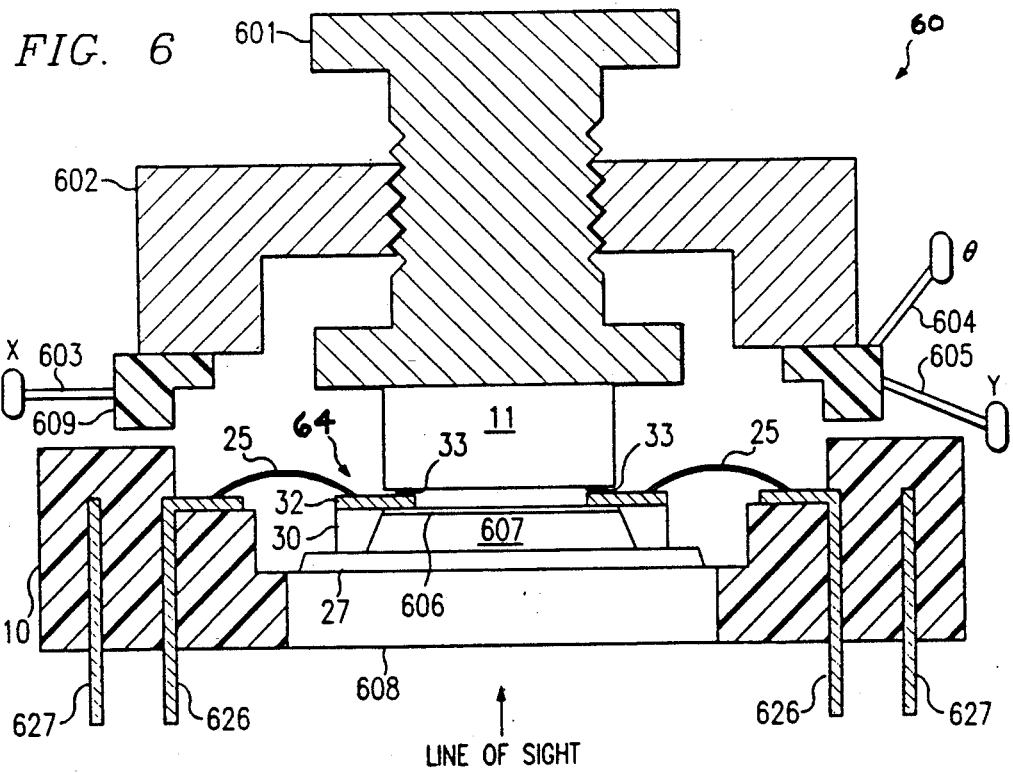
FIG. 6 is a schematic cross-sectional view of an alternative embodiment of the present invention.

FIG. 6 is a schematic cross-sectional view of an alternative embodiment of the present invention. In this embodiment, socket frame 60 performs a similar function to socket frame 20, however, socket frame 60 assures good electrical contact between connection leads 33 and landing pads on integrated circuit chip 11. In FIG. 6, socket frame 60 includes thread engaged pedestal 601 which mounts on threads within pedestal frame 602. Pedestal frame 602 attaches to socket frame lid 609 which includes x-direction adjustor at 603, radial adjustor 604 and y-direction adjustor 605. Socket frame 60 further includes socket frame base 620 into which mount connector pins 626 and ground pins 627. Within the center of socket frame base 610 is transparent window 608.

Connector pins 620 have attached to them bonding wires 25 which connect to connection circuit 32 of socket test head 64. Clear foundation plate 27 attaches to transparent material window 608 and anchors socket test head 64 to socket frame base 610. Socket test head 64, comprises within substrate 30 a transparent material 607 and transparent compliant material 606. A line of sight exists in the embodiment of FIG. 6 beginning at transparent material 608, continuing through clear foundation plate 27, base 607 and clear compliant layer 606.

Although the configuration of FIG. 6 does not have the nest arrangement of FIGS. 1-5, this alternative arrangement provides a pedestal-type holder 601 that holds integrated circuit chip 11 and permit movement in the x,y,z, and Θ directions. This allows alignment of integrated circuit chip 11 up over connection circuit 32. The configuration of FIG. 6 also provides a way to scrub contact pads of oxides and other unnecessary and obstructive materials, whether on the socket test head 34 or integrated circuit chip 11 by permitting appropriate x, y, z or Θ movement. There may be other possible configurations within the scope of the present invention to allow ease of alignment, insertion, and removal of the integrated circuit chip 11 for AC and burn-in testing.

Although the invention has been described with reference to the above specific embodiments, this description is not meant to be construed in a limiting sense. Various modifications of a disclosed embodiment, as well as alternative embodiments of the invention will become apparent to persons skilled in the art upon reference to the above description. It is further contemplated that the appended claims will cover such modifications that fall within the true scope of the invention.

What is claimed is:

1. A method for forming an apparatus for urn-in testing of a base integrated circuit chip comprising the steps of:
   forming a substrate;
   forming a compliant layer over said substrate;
   forming a connection circuit over said compliant layer; and
   forming an est to receive the integrated circuit chip over said connection circuit.

2. The method of claim 1, further comprising the step of forming solder bumps and landing pads on said connection circuit to connect between said connection circuit and the integrated circuit chip.

3. A method for forming an apparatus for burn-in testing of a base integrated circuit chip comprising the steps of:
   forming a substrate;
   forming a compliant layer over said substrate such that said substrate and said compliant layer forms a base;
   forming a connection circuit over said compliant layer; and 4. The method of claim 3, further comprising the steps of forming solder bumps and landing pads on said connection circuit to connect between said connection circuit and the integrated circuit chip.

5. The method of claim 3, further comprising the step of forming a nest to receive the integrated circuit chip over said connection circuit.

6. The method of claim 3, further comprising the steps of providing a plurality of connecting pins suitable for connecting said block to test circuitry and connecting a plurality of wire bonds between said connection circuitry to said plurality of pins.

7. The method of claim 5 and further comprising the steps of providing a plurality of connecting pins suitable for connecting said block to test circuitry and connecting a plurality of wire bonds between said connection circuitry to said plurality of pins.

* * * * *